(12) United States Patent
Imanaka

(10) Patent No.: US 12,032,032 B2
(45) Date of Patent: Jul. 9, 2024

(54) ENERGY STORAGE APPARATUS, CAPACITY ESTIMATION METHOD FOR ENERGY STORAGE DEVICE, AND CAPACITY ESTIMATION PROGRAM FOR ENERGY STORAGE DEVICE

(71) Applicant: GS Yuasa International Ltd., Kyoto (JP)

(72) Inventor: Yuki Imanaka, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 473 days.

(21) Appl. No.: 17/441,175

(22) PCT Filed: Mar. 23, 2020

(86) PCT No.: PCT/JP2020/012611
§ 371 (c)(1),
(2) Date: Sep. 20, 2021

(87) PCT Pub. No.: WO2020/196366
PCT Pub. Date: Oct. 1, 2020

(65) Prior Publication Data
US 2022/0221520 A1 Jul. 14, 2022

(30) Foreign Application Priority Data
Mar. 27, 2019 (JP) .................................. 2019-060964

(51) Int. Cl.
*H02J 7/04* (2006.01)
*B60R 16/033* (2006.01)
(Continued)

(52) U.S. Cl.
CPC .......... *G01R 31/388* (2019.01); *B60R 16/033* (2013.01); *H01M 10/425* (2013.01);
(Continued)

(58) Field of Classification Search
None
See application file for complete search history.

(56) References Cited

U.S. PATENT DOCUMENTS 6,194,874 B1 * 2/2001 Kalogeropoulos ... H02J 7/0071
320/160
9,178,372 B2 * 11/2015 Zhao ........................ H02J 7/00
(Continued)

FOREIGN PATENT DOCUMENTS

EP        2 779 356 A1     9/2014
JP        2004-291720 A    10/2004
(Continued)

OTHER PUBLICATIONS

International Search Report (ISR) (PCT Form PCT/ISA/210), in PCT/JP2020/012611, dated Jun. 23, 2020.

*Primary Examiner* — Arun C Williams
(74) *Attorney, Agent, or Firm* — MCGINN I.P. LAW GROUP, PLLC

(57) ABSTRACT

An energy storage apparatus includes external terminals, an energy storage device, a switch located in a current path from the energy storage device to the external terminal, a measurement unit that measures a current and a voltage of the energy storage device, and a management unit. The management unit cuts off discharge to an outside through the external terminal by controlling the switch when the voltage of the energy storage device falls below a threshold voltage equal to or higher than a minimum operating voltage of the measurement unit, and the management unit estimates a capacity of the energy storage device after an arbitrary time point t1 in a first period in which the voltage of the energy storage device decreases from the threshold voltage to the minimum operating voltage of the measurement unit based on an elapsed time from the arbitrary time point.

7 Claims, 13 Drawing Sheets

(51) Int. Cl.
*G01R 31/388* (2019.01)
*H01M 10/42* (2006.01)
*H01M 10/48* (2006.01)
*H02J 7/00* (2006.01)

(52) U.S. Cl.
CPC .......... *H01M 10/48* (2013.01); *H02J 7/0048* (2020.01); *H02J 7/007182* (2020.01); *H01M 2010/4271* (2013.01)

(56) References Cited

U.S. PATENT DOCUMENTS

| | | | | |
|---|---|---|---|---|
| 2004/0086295 | A1* | 5/2004 | Peng | G03G 15/2039 399/69 |
| 2011/0140670 | A1 | 6/2011 | Maetani | |
| 2013/0027561 | A1* | 1/2013 | Lee | H04N 23/611 705/7.41 |
| 2016/0094134 | A1* | 3/2016 | Iyasu | H02M 3/3378 363/17 |
| 2017/0176541 | A1 | 6/2017 | Shimizu | |
| 2017/0288425 | A1 | 10/2017 | Fukushima | |
| 2018/0080993 | A1 | 3/2018 | Shimizu | |
| 2018/0097380 | A1 | 4/2018 | Fukushima | |
| 2019/0025377 | A1 | 1/2019 | Sejima | |
| 2019/0064281 | A1 | 2/2019 | Nakagawa et al. | |
| 2020/0343598 | A1 | 10/2020 | Wada et al. | |
| 2021/0288512 | A1* | 9/2021 | Krishnan | H02J 7/35 |

FOREIGN PATENT DOCUMENTS

| | | |
|---|---|---|
| JP | 2011-115012 A | 6/2011 |
| JP | 2011-125165 A | 6/2011 |
| JP | 2014-176268 A | 9/2014 |
| JP | 2015-089714 A | 5/2015 |
| JP | 2017-099249 A | 6/2017 |
| JP | 2017-116518 A | 6/2017 |
| JP | 2017-125813 A | 7/2017 |
| JP | 2017-184534 A | 10/2017 |
| JP | 2018-048916 A | 3/2018 |
| JP | 2018-058405 A | 4/2018 |
| WO | WO 2017/221469 A1 | 12/2017 |
| WO | WO 2019/088264 A1 | 5/2019 |

\* cited by examiner

| Elapsed time T | Capacity C of secondary battery |
|---|---|
| T1 | C1 |
| T2 | C2 |
| T3 | C3 |
| T4 | C4 |
| T5 | C5 |
| T6 | C6 |
| T7 | C7 |
| T8 | C8 |
| T9 | C9 |
| T10 | C10 |

ENERGY STORAGE APPARATUS, CAPACITY ESTIMATION METHOD FOR ENERGY STORAGE DEVICE, AND CAPACITY ESTIMATION PROGRAM FOR ENERGY STORAGE DEVICE

TECHNICAL FIELD

The present invention relates to a technique for estimating a capacity of an energy storage device.

BACKGROUND ART

Some energy storage apparatuses include a measurement unit that measures a current and a voltage of an energy storage device, and a management unit that manages the energy storage device. Patent Document 1 below describes that power is supplied from an energy storage device to a measurement unit and a management unit.

PRIOR ART DOCUMENT

Patent Document

Patent Document 1: JP-A-2017-184534

SUMMARY OF THE INVENTION

Problems to be Solved by the Invention

In a case where the energy storage device supplies power to the measurement unit, when the voltage of the energy storage device becomes equal to or lower than the minimum operating voltage of the measurement unit, the measurement unit stops to be in an unmeasurable state. When the measurement unit is in an unmeasurable state, the current and the voltage of the energy storage device cannot be measured, and the capacity of the energy storage device becomes unstable.

An object of the present invention is to estimate a capacity of an energy storage device even when a voltage of the energy storage device becomes equal to or lower than a minimum operating voltage of a measurement unit.

Means for Solving the Problems

According to one aspect of the present invention, there is provided an energy storage apparatus including: an external terminal; an energy storage device; a switch located in a current path from the energy storage device to the external terminal; a measurement unit that measures a current and a voltage of the energy storage device; and a management unit. The measurement unit and the management unit receive power supply from the energy storage device. A minimum operating voltage of the management unit is lower than a minimum operating voltage of the measurement unit. The management unit cuts off discharge to an outside through the external terminal by controlling the switch when the voltage of the energy storage device falls below a threshold voltage equal to or higher than the minimum operating voltage of the measurement unit, and the management unit estimates a capacity of the energy storage device after an arbitrary time point in a first period in which the voltage of the energy storage device decreases from the threshold voltage to the minimum operating voltage of the measurement unit based on an elapsed time from the arbitrary time point.

The present technology can be applied to a capacity estimation method for an energy storage apparatus, a capacity estimation program, and a recording medium in which the capacity estimation program is recorded.

Advantages of the Invention

According to the present technology, it is possible to estimate the capacity of the energy storage device even when the voltage of the energy storage device becomes equal to or lower than the minimum operating voltage of the measurement unit.

MODE FOR CARRYING OUT THE INVENTION

Figure 1:
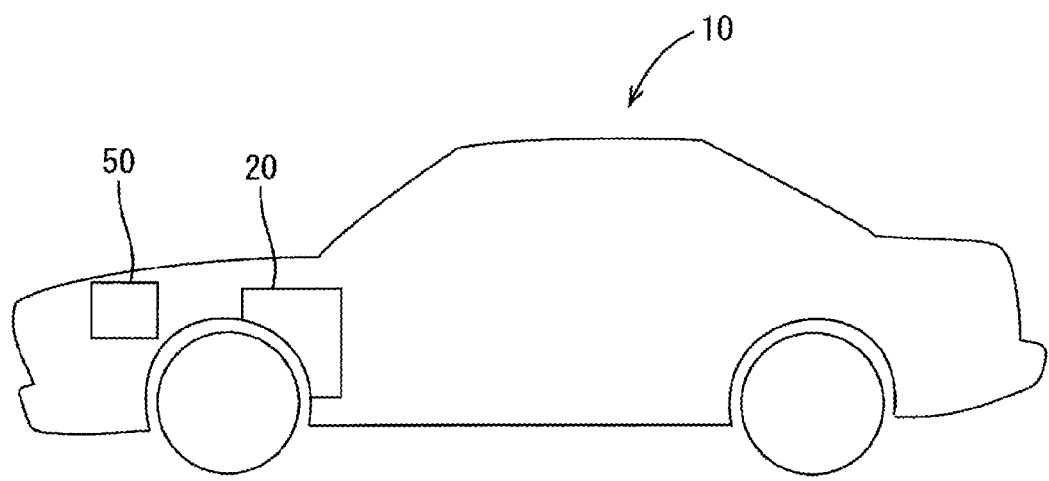
FIG. 1 is a side view of a vehicle according to an embodiment.

An energy storage apparatus includes: an external terminal; an energy storage device; a switch located in a current path from the energy storage device to the external terminal; a measurement unit that measures a current and a voltage of the energy storage device; and a management unit. The measurement unit and the management unit receive power supply from the energy storage device. A minimum operating voltage of the management unit is lower than a minimum operating voltage of the measurement unit. The management unit cuts off discharge to an outside through the external terminal by controlling the switch when the voltage of the energy storage device falls below a threshold voltage equal to or higher than the minimum operating voltage of the measurement unit, and the management unit estimates a capacity of the energy storage device after an arbitrary time point in a first period in which the voltage of the energy storage device decreases from the threshold voltage to the minimum operating voltage of the measurement unit based on an elapsed time from the arbitrary time point.

When the voltage of the energy storage device falls below the threshold voltage equal to or higher than the minimum operating voltage of the measurement unit, the management unit cuts off the discharge to the outside. When the discharge to the outside is cut off, the current is not taken out from the energy storage device to the outside. Since the energy storage device is in a state of discharge a constant current such as a current consumed inside the energy storage apparatus and a self-discharge current, a capacity decrease amount is substantially proportional to the elapsed time. By estimating the capacity of the energy storage device based on the elapsed time, the capacity can be estimated even after the measurement unit is stopped.

The management unit may calculate a capacity decrease amount of the energy storage device after an arbitrary time point based on the elapsed time, and the management unit may estimate a capacity of the energy storage device after the arbitrary time point by subtracting the capacity decrease amount from the capacity of the energy storage device at the arbitrary time point. When the voltage of the assembled battery is equal to or higher than the minimum operating voltage of the measurement unit, the measurement unit can measure the voltage and the current. Therefore, the capacity of the energy storage device at an arbitrary time point can be estimated with less error based on the measurement value of the measurement unit. Since the capacity of the energy storage device after the arbitrary time point is estimated by subtracting the capacity decrease amount according to the elapsed time from the capacity at the arbitrary time point with less estimation error, the capacity estimation accuracy is high.

The management unit may permit charge to the energy storage device by controlling the switch when the charge is detected after the arbitrary time point if the capacity of the energy storage device is within a reusable area.

When the capacity is within the reusable area, the energy storage device can be reused by receiving charge. Accordingly, the usability of the energy storage device is enhanced.

The management unit may prohibit charge to the energy storage device by controlling the switch when the charge is detected after the arbitrary time point if the capacity of the energy storage device is within a reuse prohibition area.

When the capacity is within the reuse prohibition area, the energy storage device can be prevented from being reused by prohibiting the receiving of charge. By prohibiting reuse, safety can be ensured.

The energy storage apparatus may be for a vehicle, the management unit may cut off discharge to an outside through the external terminal by controlling the switch when the voltage of the energy storage device falls below a threshold voltage equal to or higher than the minimum operating voltage of the measurement unit while the vehicle is parked, and the management unit may estimate a capacity of the energy storage device after an arbitrary time point in a first period in which the voltage of the energy storage device decreases from the threshold voltage to the minimum operating voltage of the measurement unit based on an elapsed time from the arbitrary time point.

During parking, a vehicle generator does not generate power because an engine stops. Since the energy storage device is not charged and continues to be discharged, the voltage of the energy storage device falls below the minimum operating voltage of the measurement unit, and the measurement tends to be impossible. By applying the present technology during parking in which measurement tends to be impossible, it is possible to estimate the capacity of the energy storage device even after the voltage of the energy storage device falls below the minimum operating voltage of the measurement unit.

First Embodiment

1. Description of Battery 50

Figure 2:
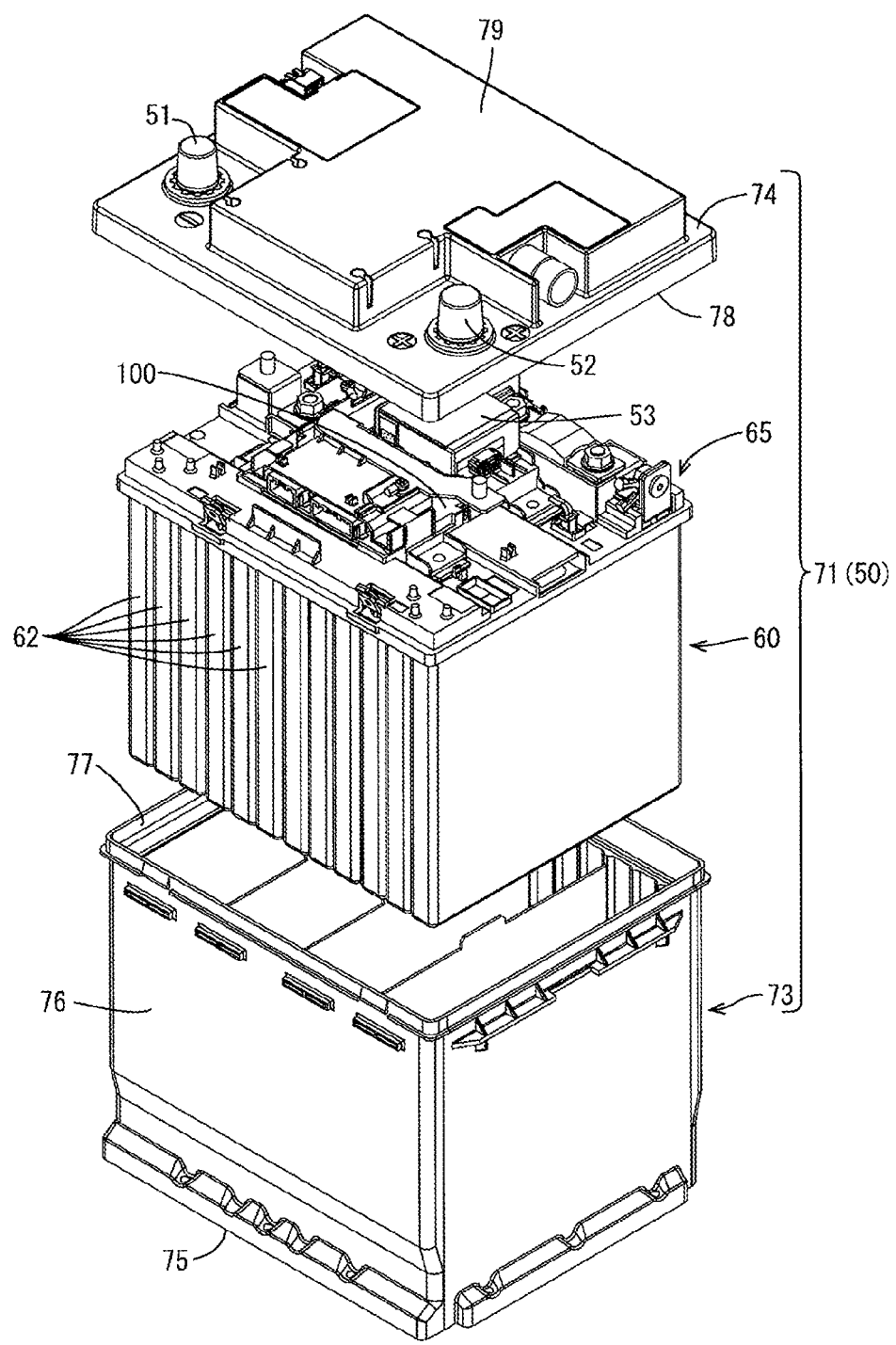
FIG. 2 is an exploded perspective view of a battery.

FIG. 1 is a side view of a vehicle, and FIG. 2 is an exploded perspective view of a battery. A vehicle 10 is an engine-driven vehicle, and includes an engine 20 and a battery 50. In FIG. 1, only the engine 20 and the battery 50 are illustrated, and other components constituting the vehicle 10 are omitted. The battery 50 is an example of an "energy storage apparatus".

As illustrated in FIG. 2, the battery 50 includes an assembled battery 60, a circuit board unit 65, and a housing 71.

The housing 71 includes a main body 73 made of a synthetic resin material and a lid body 74. The main body 73 has a bottomed cylindrical shape. The main body 73 includes a bottom surface portion 75 and four side surface portions 76. An upper opening 77 is formed at the upper end portion by the four side surface portions 76.

The housing 71 houses the assembled battery 60 and the circuit board unit 65. The assembled battery 60 includes twelve secondary batteries 62. The twelve secondary batteries 62 are connected in three parallel and four series. The circuit board unit 65 is disposed above the assembled battery 60. In the block diagram of FIG. 6, three secondary batteries 62 connected in parallel are represented by one battery symbol. The secondary battery 62 is an example of an "energy storage device".

The lid body 74 closes the upper opening 77 of the main body 73. An outer peripheral wall 78 is provided around the lid body 74. The lid body 74 has a protrusion 79 having a substantially T-shape in plan view. An external terminal 51 of the positive electrode is fixed to one corner portion of the front portion of the lid body 74, and an external terminal 52 of the negative electrode is fixed to the other corner portion.

Figure 3:
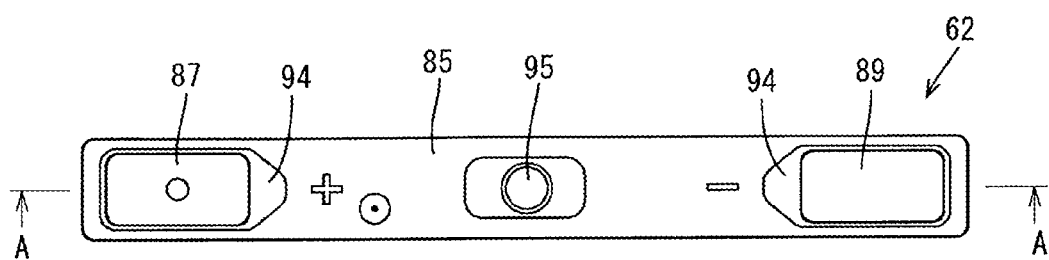
FIG. 3 is a plan view of a secondary battery.
Figure 4:
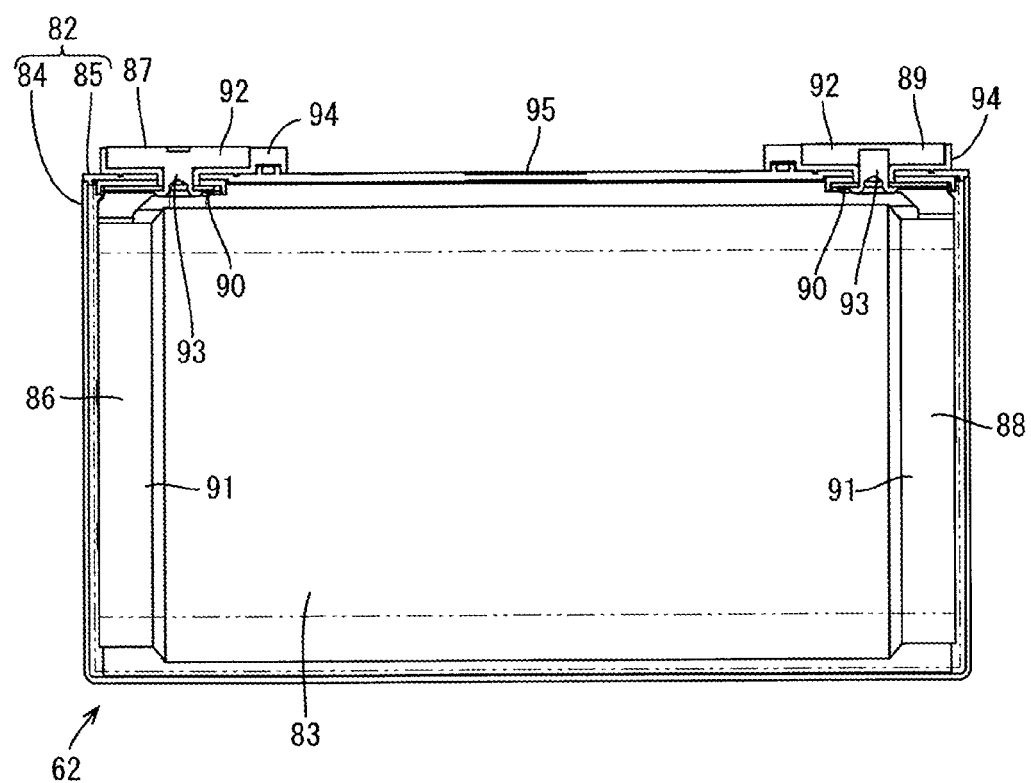
FIG. 4 is a sectional view taken along the line A-A of FIG. 3.

As illustrated in FIGS. 3 and 4, in the secondary battery 62, an electrode assembly 83 is housed in a rectangular parallelepiped case 82 together with a nonaqueous electrolyte. The secondary battery 62 is, for example, a lithium ion secondary battery. The case 82 includes a case body 84 and a lid 85 that closes an opening portion above the case body.

Although not illustrated in detail, the electrode assembly 83 is formed by disposing a separator formed of a porous resin film between a negative electrode element formed by applying an active material to a substrate formed of a copper foil and a positive electrode element formed by applying an active material to a substrate formed of an aluminum foil. The negative electrode element, the positive electrode element, and the separator all have a band shape and are wound in a flat shape so as to be housed in the case body 84 in a state where the negative electrode element and the positive electrode element are displaced to opposite sides in the width direction with respect to the separator.

A positive electrode terminal 87 is connected to the positive electrode element via a positive electrode current collector 86, and a negative electrode terminal 89 is connected to the negative electrode element via a negative electrode current collector 88. Each of the positive electrode current collector 86 and the negative electrode current collector 88 includes a flat plate-shaped pedestal portion 90 and a leg portion 91 extending from the pedestal portion 90. A through hole is formed in the pedestal portion 90. The leg portion 91 is connected to the positive electrode element or the negative electrode element. Each of the positive electrode terminal 87 and the negative electrode terminal 89 includes a terminal body portion 92 and a shaft portion 93 protruding downward from a center portion of a lower surface of the terminal body portion 92. The terminal body portion 92 and the shaft portion 93 of the positive electrode terminal 87 are integrally formed of aluminum (single material). In the negative electrode terminal 89, the terminal body portion 92 is made of aluminum, and the shaft portion 93 is made of copper, and these are assembled. The terminal body portions 92 of the positive electrode terminal 87 and the negative electrode terminal 89 are disposed at both end portions of the lid 85 via gaskets 94 made of an insulating material, and are exposed outward from the gaskets 94.

The lid 85 includes a pressure release valve 95. As illustrated in FIG. 3, the pressure release valve 95 is located between the positive electrode terminal 87 and the negative electrode terminal 89. When the internal pressure of the case 82 exceeds the limit value, the pressure release valve 95 is released to lower the internal pressure of the case 82.

Figure 5:
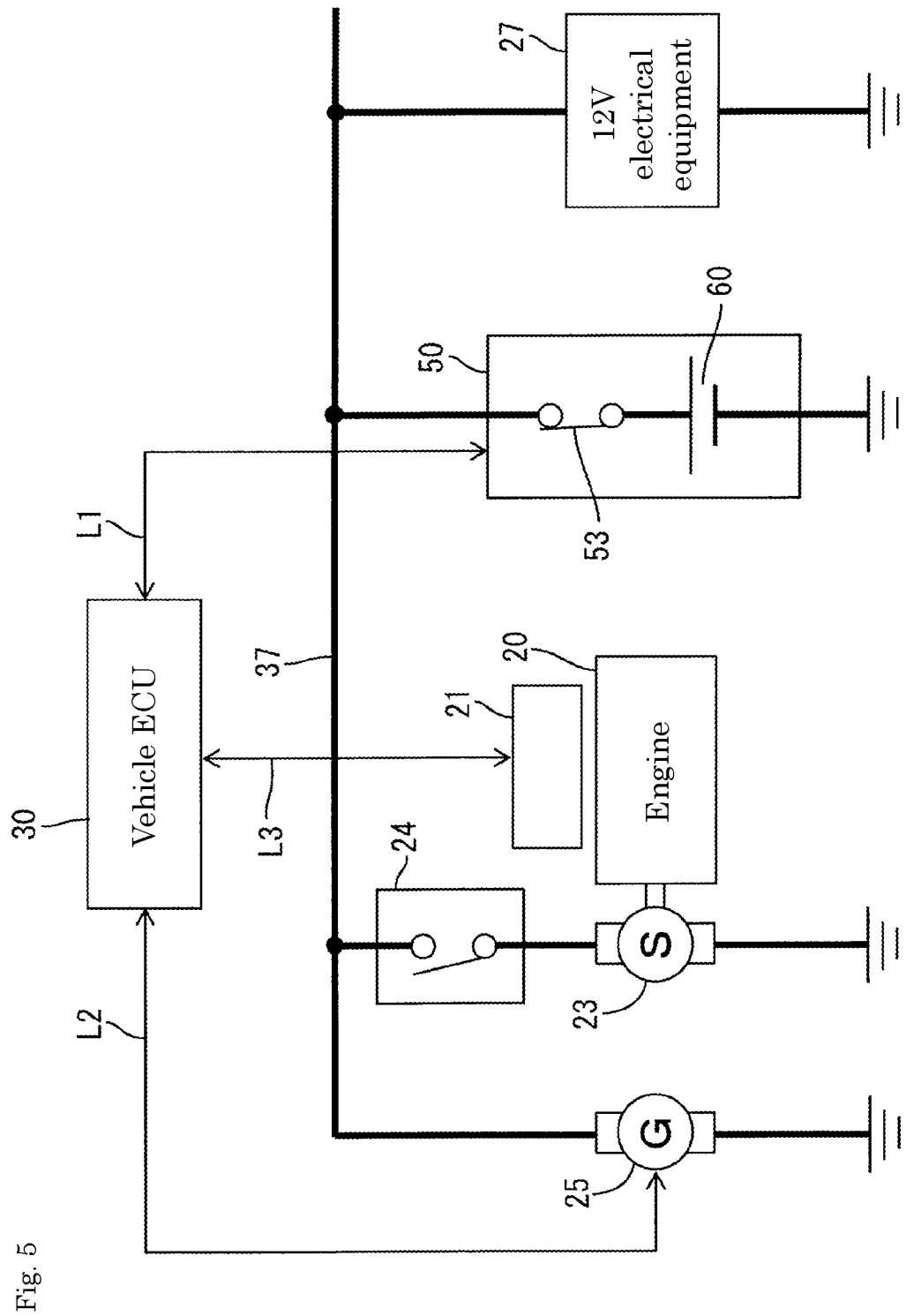
FIG. 5 is a block diagram illustrating an electrical configuration of the vehicle.

FIG. 5 is a block diagram illustrating an electrical configuration of the vehicle 10.

The vehicle 10 includes the engine 20 which is a driving device, an engine control unit 21, an engine starting device 23, an alternator 25 which is a vehicle generator, electrical equipment 27, a vehicle electronic control unit (ECU) 30, the battery 50, and the like.

The battery 50 is connected to a power line 37. The engine starting device 23, the alternator 25, and the electrical equipment 27 are connected to the battery 50 via the power line 37.

The engine starting device 23 is a cell motor. When an ignition switch 24 is turned on, a cranking current flows from the battery 50, and the engine starting device 23 is driven. The driving of the engine starting device 23 rotates a crankshaft, and the engine 20 can be started.

The electrical equipment 27 is rated at 12 V and examples thereof include an air conditioner, an audio system, a car navigation system, and auxiliary equipment. The engine starting device 23 and the electrical equipment 27 are examples of an "electric load".

The alternator 25 is a vehicle generator that generates power by the power of the engine 20. When the power generation amount of the alternator 25 exceeds the electric load amount of the vehicle 10, the battery 50 is charged by the alternator 25. When the power generation amount of the alternator 25 is smaller than the electric load amount of the vehicle 10, the battery 50 is discharged to compensate for the shortage of the power generation amount.

The vehicle ECU 30 is communicably connected to the battery 50 via a communication line L1, and is communicably connected to the alternator 25 via a communication line L2. The vehicle ECU 30 receives information on SOC and a capacity C from the battery 50, and controls the SOC and the capacity C of the battery 50 by controlling the power generation amount of the alternator 25.

The vehicle ECU 30 is communicably connected to the engine control unit 21 via a communication line L3. The engine control unit 21 is mounted on the vehicle 10 and monitors the operating state of the engine 20. The engine control unit 21 monitors the traveling state of the vehicle 10 from measurement values of meters such as a speed measuring instrument. The vehicle ECU 30 can obtain information on whether the ignition switch 24 is turned on or off, information on an operating state of the engine 20, and information on a traveling state (in the middle of traveling, traveling stop, idling stop, etc.) of the vehicle 10 from the engine control unit 21.

Figure 6:
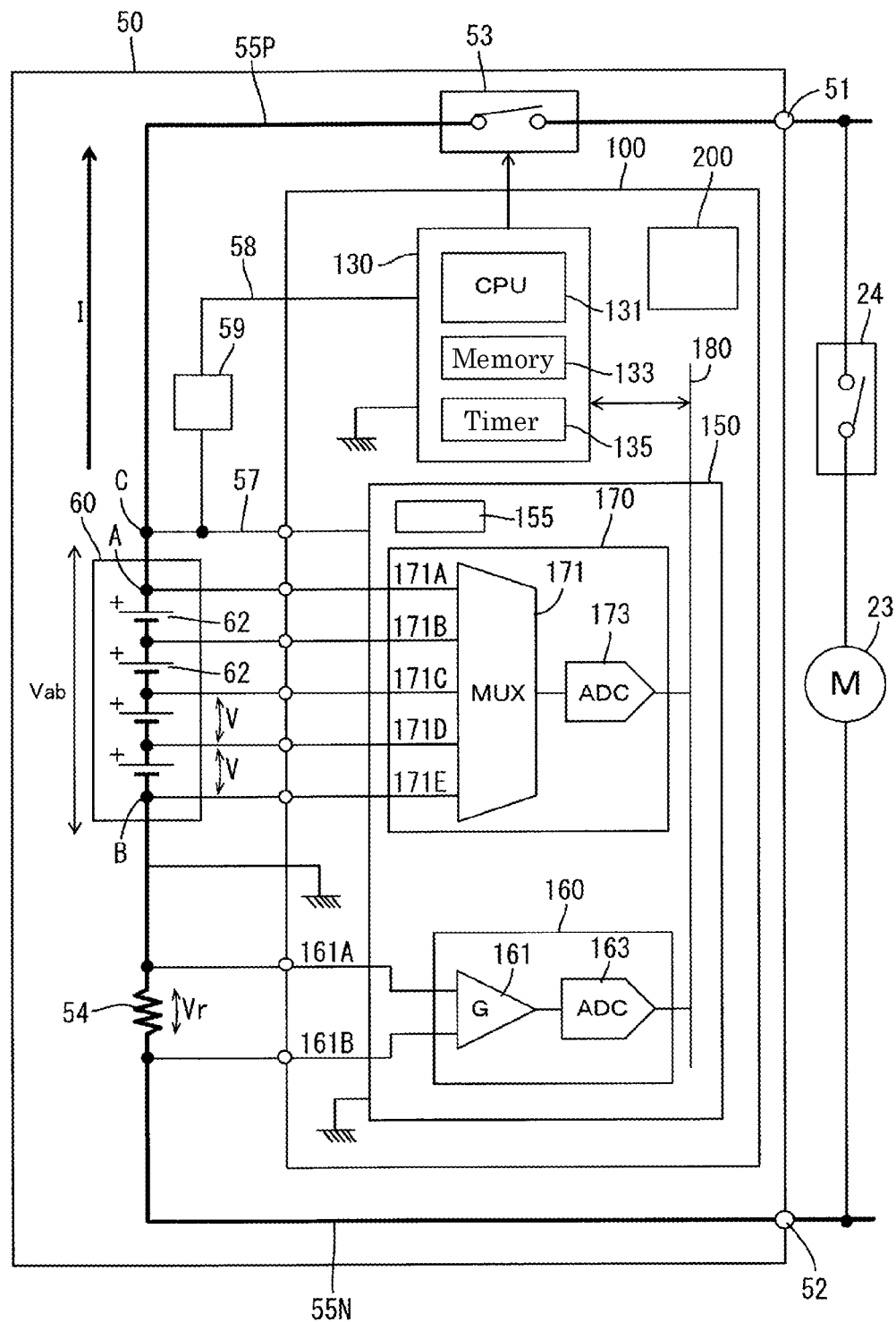
FIG. 6 is a block diagram illustrating an electrical configuration of the battery.

FIG. 6 is a block diagram illustrating an electrical configuration of the battery 50. The battery 50 includes the assembled battery 60, a resistor 54, a switch 53, a management unit 130, a measurement unit 150, a temperature sensor, and a charge detection circuit 200. The assembled battery 60 includes the plurality of secondary batteries 62 connected in series. The battery 50 is rated at 12 V.

The assembled battery 60, the switch 53, and the resistor 54 are connected in series via power lines 55P and 55N.

The power line 55P is a power line that connects the external terminal 51 of the positive electrode and the positive electrode of the assembled battery 60. The power line 55N is a power line that connects the external terminal 52 of the negative electrode and the negative electrode of the assembled battery 60. The power line 55P and the power line 55N are current paths.

The switch 53 is located on the positive electrode side of the assembled battery 60, and is provided on the power line 55P on the positive electrode side. The switch 53 is a semiconductor switch such as an FET or a relay. By opening the switch 53, the current of the battery 50 can be cut off. The switch 53 is controlled to be closed in a normal state.

The resistor 54 is located at the negative electrode of the assembled battery 60 and is provided in the power line 55N on the negative electrode side.

The measurement unit 150 is mounted on the circuit board 100, and includes a current measurement unit 160 and a voltage measurement unit 170. The measurement unit 150 is connected to the power line 55P on the positive electrode side via a branch line 57. The branch line 57 is connected to a point C on the power line 55P. The point C is located closer than the switch 53 as viewed from the assembled battery 60, and the measurement unit 150 receives power supply from the assembled battery 60 through the branch line 57 regardless of turning on and off of the switch 53. The measurement unit 150 includes a step-down circuit 155. The step-down circuit 155 steps down a voltage Vab of the assembled battery 60 and supplies power to the current measurement unit 160 and the voltage measurement unit 170.

The current measurement unit 160 includes an amplifier 161 and an AD converter 163. The amplifier 161 amplifies a voltage Vr between both ends of the resistor 54. The AD converter 163 converts a power value of the amplifier 161 from an analog signal into a digital signal and outputs the converted signal. The current measurement unit 160 detects an current I of the battery 50 from a voltage difference Vr between two input terminals 161A and 161B.

The voltage measurement unit 170 includes a multiplexer 171 and an AD converter 173. The multiplexer 171 includes five input terminals 171A to 171E. The five input terminals 171A to 171E are electrically connected to electrodes of the secondary batteries 62, respectively.

The multiplexer 171 sequentially detects and outputs the voltage V of each secondary battery 62 while switching the secondary battery 62 to be measured. The AD converter 173 converts a power value of the multiplexer 171 from an analog signal to a digital signal and outputs the converted signal.

The current measurement unit 160 and the voltage measurement unit 170 are connected to the management unit 130 via a bus 180, and power (measurement values) of both the measurement units 160 and 170 are input to the management unit 130.

As illustrated in FIG. 6, the management unit 130 is mounted on the circuit board 100. The management unit 130 includes a CPU 131, a memory 133, and a timer 135. The management unit 130 is connected to the power line 55P on the positive electrode side via a branch line 58. The branch line 58 is connected to the point C on the power line 55P. The point C is located closer than the switch 53 as viewed from the assembled battery 60, and the management unit 130 receives power supply from the assembled battery 60 through the branch line 58 regardless of turning on and off of the switch 53. The branch line 58 is provided with a regulator 59. The regulator 59 steps down the voltage Vab of the assembled battery 60 and supplies power to the management unit 130.

The management unit 130 can obtain information regarding the state of the vehicle 10, such as whether the vehicle 10 is parked or traveling, from the vehicle ECU 30.

The management unit 130 measures the current I of the assembled battery 60, the voltage V of each secondary battery 62, the voltage Vab of the assembled battery 60, and the temperature of the assembled battery 60 at a predetermined measurement cycle N by the current measurement unit 160, the voltage measurement unit 170, and the temperature sensor, and monitors the state of the battery 50. The memory 133 stores a monitoring program for executing a monitoring process of the battery 50 (flowchart of FIG. 8) and a capacity estimation program for executing a capacity estimation process of the battery 50 (flowchart of FIG. 9).

Figure 7:
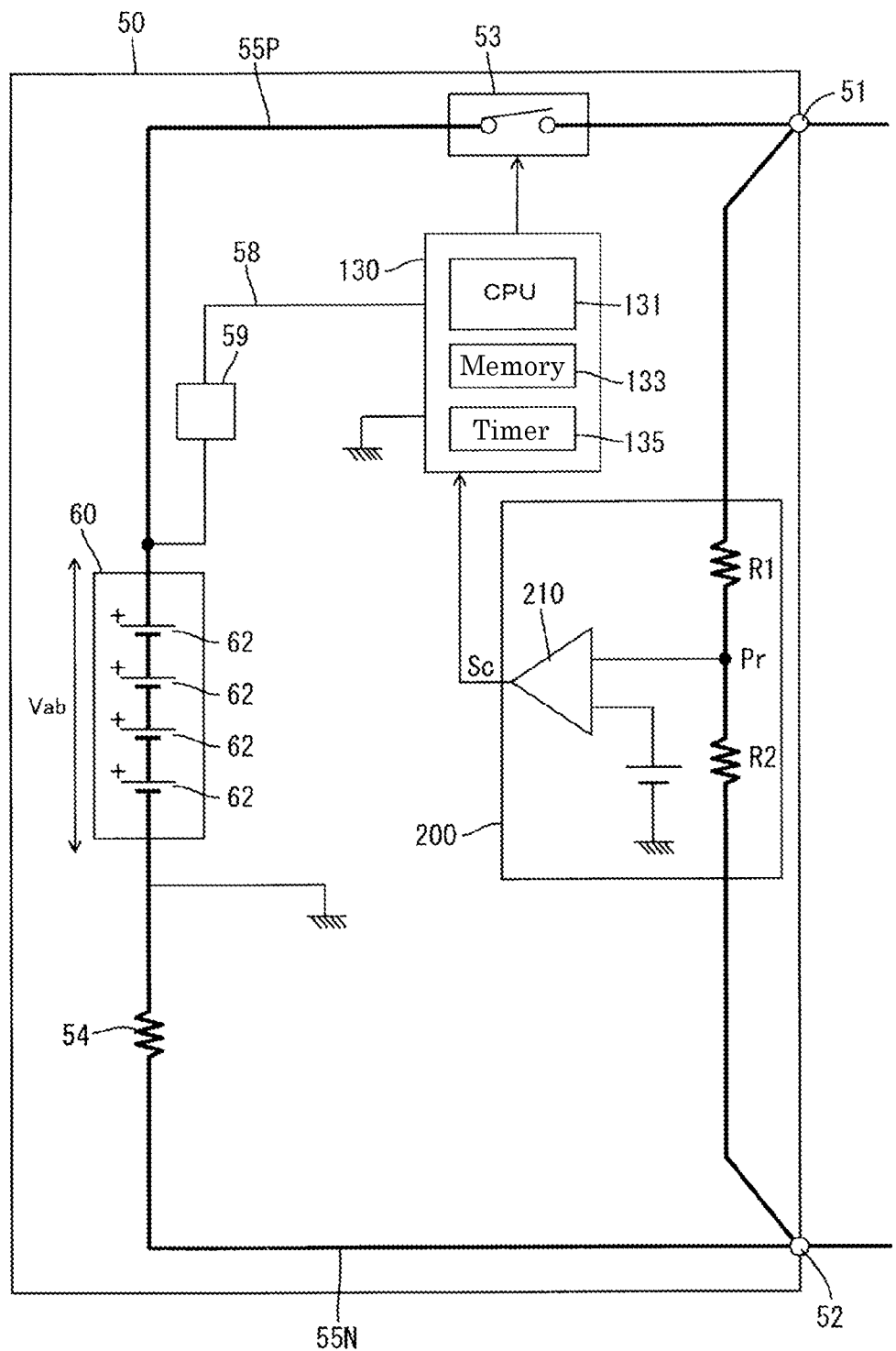
FIG. 7 is a block diagram of a charge detection circuit.

As illustrated in FIG. 7, the charge detection circuit 200 includes two detection resistors R1 and R2 and a comparator 210. The two detection resistors R1 and R2 are connected in series between the two external terminals 51 and 52.

The comparator 210 compares a voltage at a connection point Pr of the two detection resistors R1 and R2 with a reference voltage. When the voltage at the connection point Pr is higher than the reference voltage (during charge), the comparator 210 outputs a charge detection signal Sc. The management unit 130 can detect whether or not the battery 50 is charged based on the charge detection signal Sc.

2. Monitoring Process of Battery 50

Figure 8:
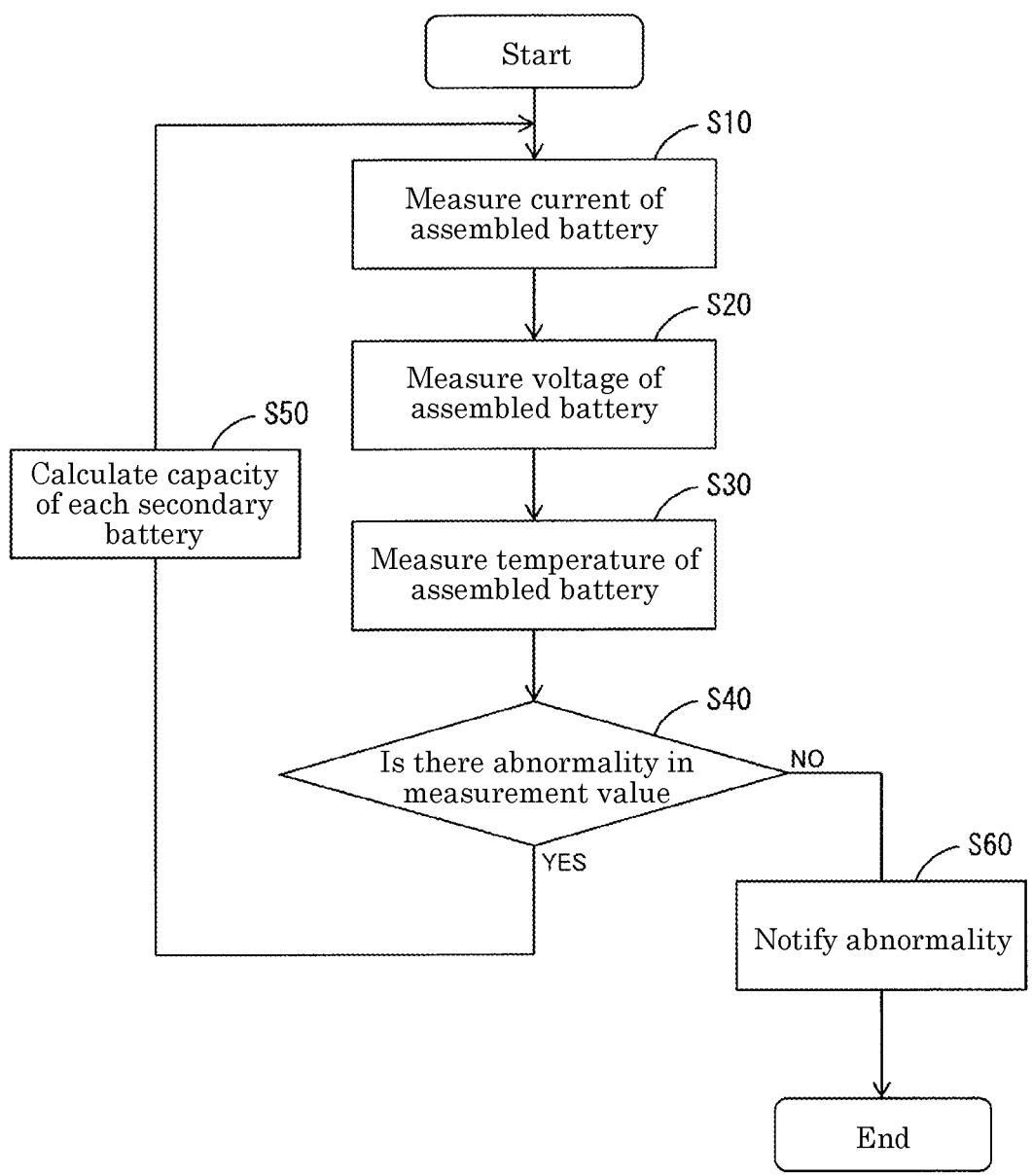
FIG. 8 is a flowchart of a monitoring process.

FIG. 8 is a flowchart of a monitoring process of the battery 50. The monitoring process of the battery 50 is always executed at the predetermined measurement cycle N during the activation of the management unit 130 regardless of the state of the vehicle 10.

The monitoring process of the battery 50 includes S10 to S60.

When the monitoring process is started, the management unit 130 measures the current I of the assembled battery 60 using the current measurement unit 160 (S10). The management unit 130 measures the voltage V of each secondary battery 62 and the voltage Vab of the assembled battery 60 using the voltage measurement unit 170, and measures a temperature T of the assembled battery 60 using the temperature sensor (S20, S30). The voltage Vab of the assembled battery 60 is a voltage between points A and B in FIG. 6, and is a total of the voltages (total voltage) of the four secondary batteries 62.

Thereafter, the management unit 130 temporarily stores each measurement value in the memory 133, and performs a process of determining whether there is an abnormality in the measurement value (S40).

When there is no abnormality in the measurement value (S40: YES), the management unit 130 calculates the capacity C of each secondary battery 62 based on the integral value with respect to time of the current I measured by the current measurement unit 160 as expressed by Expression (1) below (S50). + is charge, and − is discharge.

$$C = Cf \pm (\int I dt) \quad (1)$$

Cf is an initial value (full charge capacity) of the capacity C of each secondary battery 62, and I is a current.

The capacity C is not limited to be calculated from the integrated value of the current I, and may be calculated from the correlation with the voltage Vab. That is, the capacity C may be calculated from the measurement value of the voltage Vab using the correlation between the voltage Vab and the capacity C.

When there is no abnormality in the measurement value (S40: YES), the processes of S10 to S50 is repeatedly performed at the predetermined measurement cycle N, and the capacity C of each secondary battery 62 is calculated for each measurement cycle N.

When there is an abnormality in the measurement value (S40: NO), the management unit 130 performs a process of notifying the abnormality to the vehicle ECU 30 (S60).

3. Capacity Estimation in Unmeasurable State

The management unit 130 and the measurement unit 150 use the assembled battery 60 as a power source, and receive power supply from the assembled battery 60. The minimum operating voltage is the minimum voltage at which the management unit 130 and the measurement unit 150 can continuously operate without stopping the operation.

The measurement unit 150 can operate only when the minimum operating voltage is V1 and the voltage Vab of the assembled battery 60 is equal to or higher than the minimum operating voltage V1.

The management unit 130 can operate only when the minimum operating voltage is V2 and the voltage Vab of the assembled battery 60 is equal to or higher than the minimum operating voltage V2.

The minimum operating voltage V2 of the management unit 130 is lower than the minimum operating voltage V1 of the measurement unit 150. That is, V1>V2. As an example, V1=5 [V], and V2=3.3 [V].

In a case where the minimum operating voltage V2 is smaller than the minimum operating voltage V1 (V1>V2), when the voltage Vab of the assembled battery 60 gradually decreases along with discharge, the measurement unit 150 first stops at the time point when the voltage Vab decreases to the minimum operating voltage V1, and then the management unit 130 stops at the time point when the voltage Vab decreases to the minimum operating voltage V2. That is, during a period W12 in which the voltage Vab of the assembled battery 60 decreases from the minimum operating voltage V1 to the minimum operating voltage V2, the measurement unit 150 is stopped, but the management unit 130 continues the operation (see FIG. 10).

By executing the following capacity estimation process, the management unit 130 estimates the capacity C of each secondary battery 62 for the period W12 in which the measurement unit 150 is stopped to be in an unmeasurable state.

Figure 9:
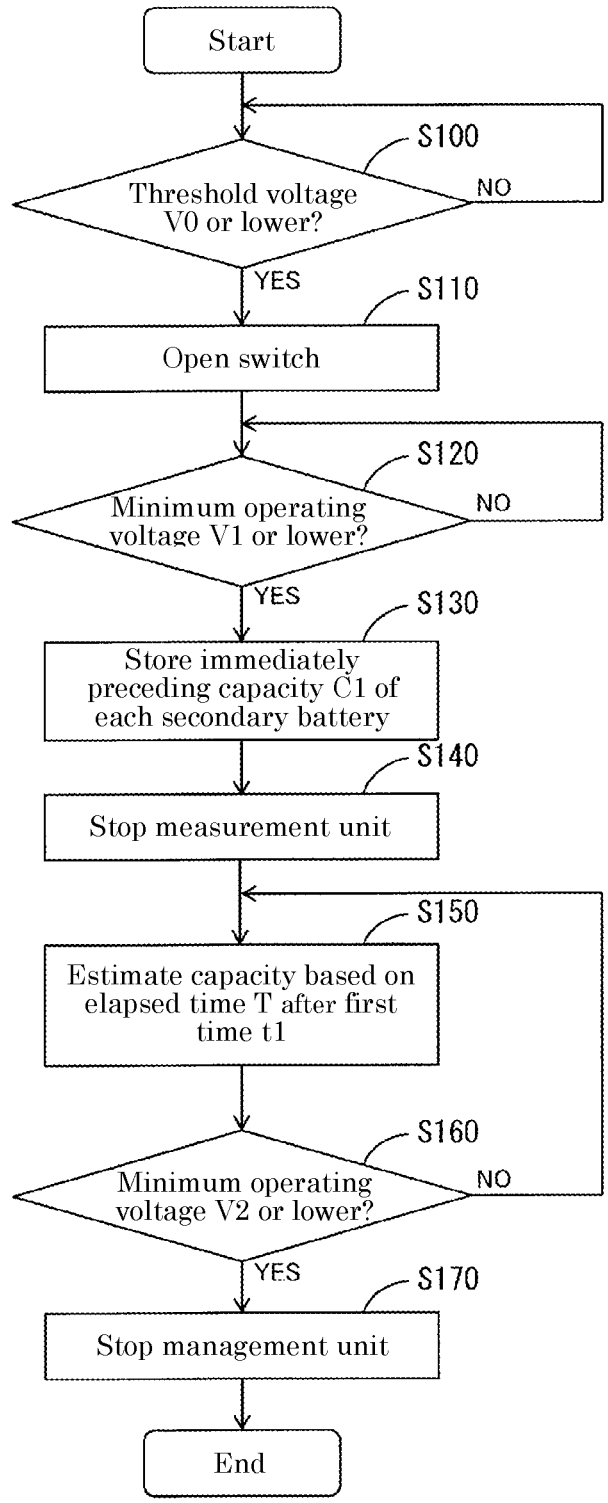
FIG. 9 is a flowchart of a capacity estimation process.

FIG. 9 is a flowchart of the capacity estimation process. The capacity estimation process includes eight steps of S100 to S170, and is executed after the vehicle 10 is parked.

When the management unit 130 receives information indicating that the vehicle 10 is parked from the vehicle ECU 30 through communication, the management unit 130 performs a process of comparing the voltage Vab of the assembled battery 60 measured by the measurement unit 150 with a threshold voltage V0 (S100). The threshold voltage V0 is a voltage equal to or higher than the minimum operating voltage V1 of the measurement unit 150, and is 6 V as an example. The threshold voltage V0 may be equal to the minimum operating voltage V1 (V0=V1).

Figure 10:
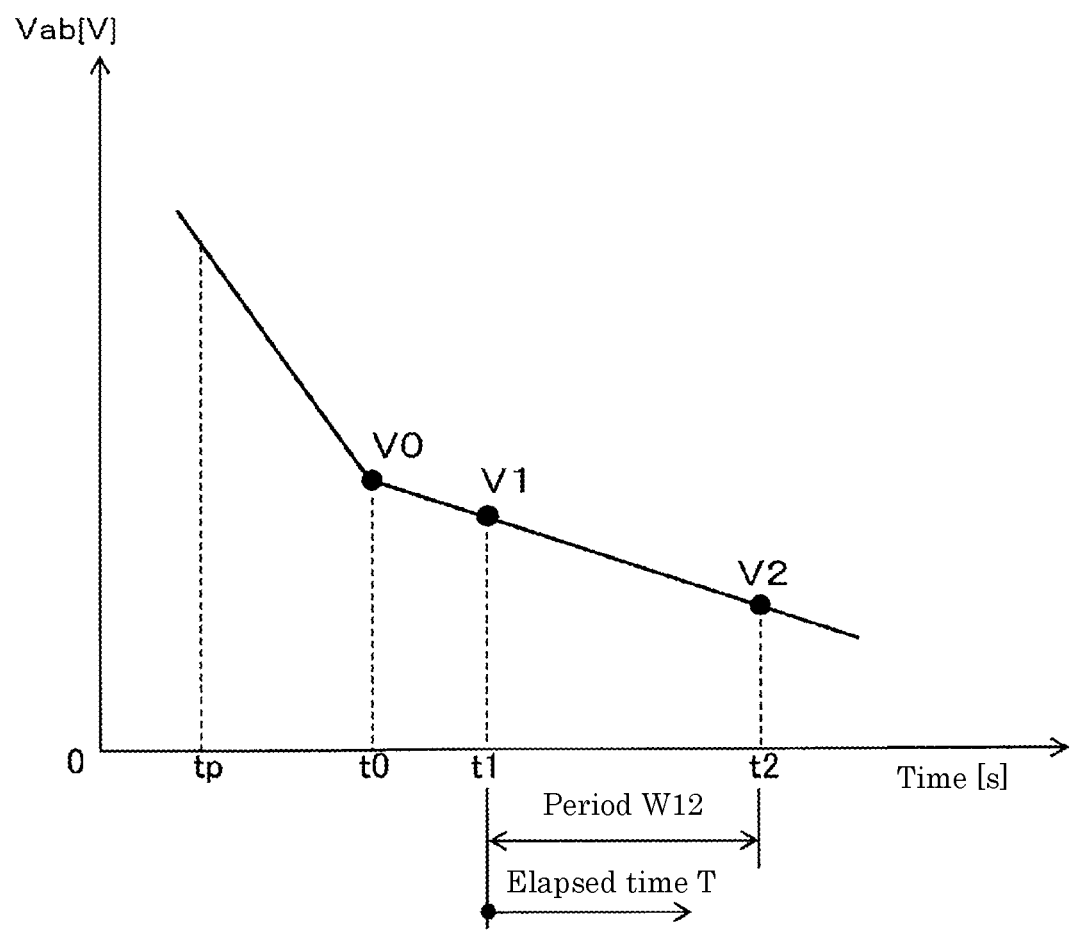
FIG. 10 is a graph showing a voltage transition of an assembled battery after parking.

FIG. 10 is a graph showing a voltage transition of the assembled battery 60 with respect to time after parking. When the assembled battery 60 is normal, the switch 53 is closed, and since a dark current flows from the battery 50 to the vehicle 10 after parking, the voltage Vab of the assembled battery 60 decreases after a parking start time point tp. The dark current is a current consumed by the vehicle 10 during parking.

When the voltage Vab of the assembled battery 60 becomes equal to or lower than the threshold voltage V0, the management unit 130 switches the switch 53 from the closed state to the opened state (S110). In the graph of FIG. 10, the switch 53 is opened at time t0 when the voltage Vab of the assembled battery 60 becomes equal to or lower than the threshold voltage V0.

By opening the switch 53, it is possible to cut off discharge from the battery 50 to the vehicle 10, that is, discharge to the electrical equipment 27 connected to the external terminals 51 and 52.

After the discharge is cut off, the management unit 130 performs a process of comparing the voltage Vab of the assembled battery 60 measured by the measurement unit 150 with the minimum operating voltage V1 of the measurement unit 150 (S120).

When the voltage Vab of the assembled battery 60 decreases to the minimum operating voltage V1 or lower, the management unit 130 stores the capacity C1 of each secondary battery 62 immediately before the voltage Vab of the assembled battery 60 reaches the minimum operating voltage V1 in the memory 133 (S130).

In the graph of FIG. 10, the voltage Vab of the assembled battery 60 decreases to the minimum operating voltage V1 at first time t1, and the capacity C1 of each secondary battery 62 which is calculated in the monitoring process (S50) immediately before the first time t1 is stored in the memory 133.

After the first time t1, since the voltage Vab of the assembled battery 60 is equal to or lower than the minimum operating voltage V1, the measurement unit 150 stops (S140). Therefore, the capacity C of each secondary battery 62 cannot be calculated using the measurement values of the current and the voltage of the assembled battery 60.

After the first time t1, the management unit 130 counts an elapsed time T from the first time t1 using the timer 135. The management unit 130 obtains a capacity decrease amount ΔC from the elapsed time T. For example, as expressed in Expression (2), the capacity decrease amount ΔC is obtained by the product of a current value Ia and the elapsed time T.

The current value Ia is a current discharged by each secondary battery 62 after the first time t1. The current value Ia is a total value of the consumption current of the management unit 130, the consumption current of the measurement unit 150, the consumption current of the charge detection circuit 200, and the self-discharge current of each secondary battery 62. The current value Ia can be a theoretical value or an empirical value, and is a fixed value.

As expressed in Expression (3), the management unit 130 estimates the capacity C of each secondary battery 62 after the first time t1 by subtracting the capacity decrease amount ΔC from the capacity C1 immediately before the first time t1 (S150).

$$\Delta C = Ia \times T \quad (2)$$

$$C = C1 - \Delta C \quad (3)$$

The estimation process of the capacity C is executed at predetermined intervals during the period W12 in which the voltage Vab of the assembled battery 60 decreases from the minimum operating voltage V1 to the minimum operating voltage V2. Then, when the voltage Vab of the assembled battery 60 decreases to V2 (S160: YES), the management unit 130 stops (S170).

Figure 11:
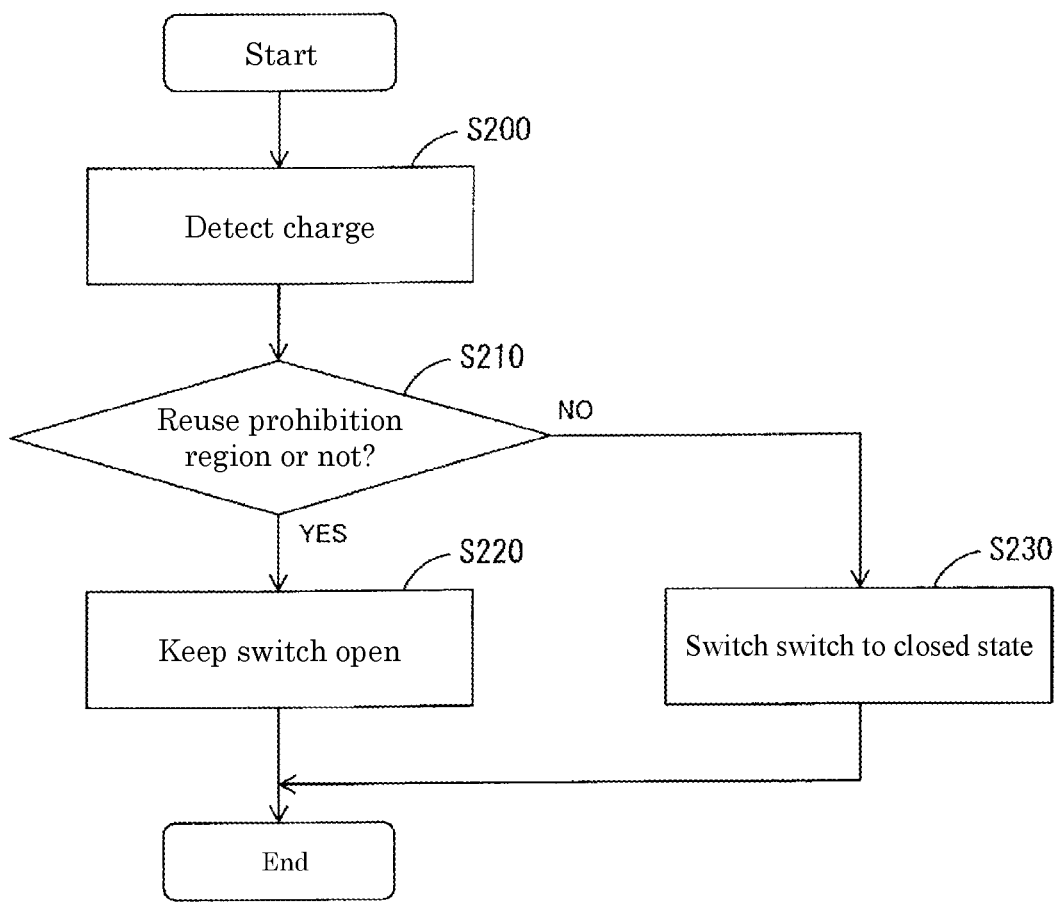
FIG. 11 is a flowchart of charge control.

FIG. 11 is a charge control flowchart, and is performed when the charge detection circuit 200 detects charge in the period W12. The charge may be charge from the alternator or charge from an external charger outside the vehicle.

When detecting the charge from the power of the charge detection circuit 200, the management unit 130 compares the capacity C of each secondary battery 62 estimated in S150 with a reuse prohibition area H2.

Figures 12, 13:
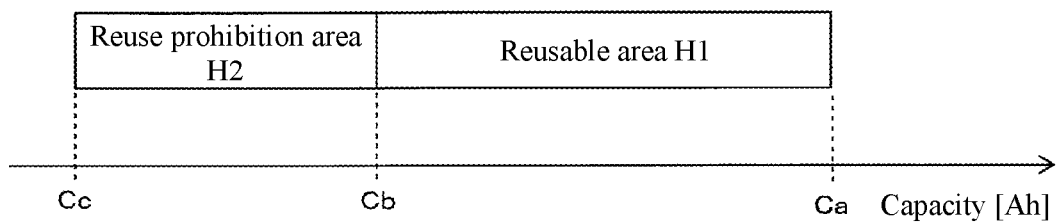
FIG. 12 is a diagram illustrating a reusable area and a reuse prohibition area of the secondary battery.
FIG. 13 is a data table of an elapsed time T and a capacity C of the secondary battery.

As illustrated in FIG. 12, the secondary battery 62 is provided with a reusable area H1 and the reuse prohibition area H2 depending on the size of the capacity C. The reusable area H1 is a region from Cb to Ca that can be reused by charge. The reuse prohibition area H2 is a region from Cc to Cb in which safety cannot be secured at the time of reuse due to overdischarge or the like, and reuse by charge is prohibited. A relationship of Cc<Cb<Ca is satisfied.

When any one of the four secondary batteries 62 constituting the assembled battery 60 is included in the reuse prohibition area H2, the management unit 130 keeps the switch 53 open (S220). By keeping the switch 53 open, the assembled battery 60 is kept disconnected from the external terminal 51. Therefore, it is possible to prohibit charge and suppress reuse of the battery 50.

When all the secondary batteries 62 are not included in the reuse prohibition area H2 (included in the reusable area), the management unit 130 switches the switch 53 from the opened state to the closed state (S230). By switching the switch 53 from the opened state to the closed state, the assembled battery 60 is conducted to the external terminal 51. Therefore, it is possible to receive charge and reuse the battery 50.

4. Effects

When the voltage Vab of the assembled battery 60 decreases to the threshold voltage V0 while the vehicle is parked, the management unit 130 opens the switch 53 to cut off the discharge from the battery 50 to the vehicle 10. Since there is no discharge to the vehicle 10 after the discharge is cut off, the secondary battery 62 thereafter discharges only the current consumed in the battery and the self-discharge current, and the capacity decrease amount ΔC is substantially proportional to the elapsed time T.

Therefore, the capacity C of each secondary battery 62 after the measurement unit is stopped can be estimated based on the elapsed time T. From the capacity C after the measurement unit is stopped, it is possible to determine whether or not the battery 50 can be reused after the measurement unit is stopped.

When the capacity of the secondary battery 62 cannot be estimated after the measurement unit 150 is stopped, it is conceivable that the state of the battery 50 is indeterminate and reuse is uniformly prohibited. However, in this case, reuse of the battery 50 that can actually still be used may be prohibited. By using the present technology, the battery 50 can be used up to the use limit, and the usability of the battery 50 is high.

Other Embodiments

The present invention is not limited to the embodiments described above referring to the drawings, and, for example, the following embodiments are also included in the technical scope of the present invention.

(1) In the embodiment, the secondary battery 62 is described as an example of an energy storage device. The energy storage device is not limited to the secondary battery 62, and may be a capacitor. The secondary battery 62 is not limited to a lithium ion secondary battery, and may be another nonaqueous electrolyte secondary battery. A lead-acid battery or the like can also be used. The energy storage device is not limited to a plurality of energy storage devices, and may have a single (single cell) configuration.

(2) In the embodiment, the battery 50 is used for starting the engine. The use of the battery 50 is not limited to a specific use. The battery 50 may be used in various applications such as a mobile object (vehicle, ship, AGV, etc.) and an industrial application (an energy storage apparatus of an uninterruptible power supply system or a solar power generating system).

(3) In the embodiment, the capacity C1 immediately before the first time t1 is calculated from the current measurement value. The capacity C has a correlation with the voltage V. The capacity C1 at the time t1 is a correlation value with the minimum operating voltage V1. Therefore, the capacity C1 at the time t1 is not limited to the case of being obtained from the current measurement value, and may be a fixed value (correlation value of the minimum operating voltage V1). That is, the capacity C of the secondary battery 62 after the first time t1 may be estimated by subtracting the capacity decrease amount ΔC from the fixed value (correlation value of the minimum operating voltage V1).

In addition, since the capacity C of the secondary battery 62 after the first time t1 decreases substantially in proportion to the elapsed time T, the capacity C of the secondary battery 62 after the first time t1 may be estimated using a data table in which the elapsed time T and the capacity C are associated with each other as illustrated in FIG. 13.

(4) In the embodiment, the capacity estimation process of FIG. 9 is performed while the vehicle is parked, but may be performed at any time when the voltage Vab of the assembled battery 60 is lower than the threshold voltage V0. It may be performed at a timing other than during parking.

Figure 14:
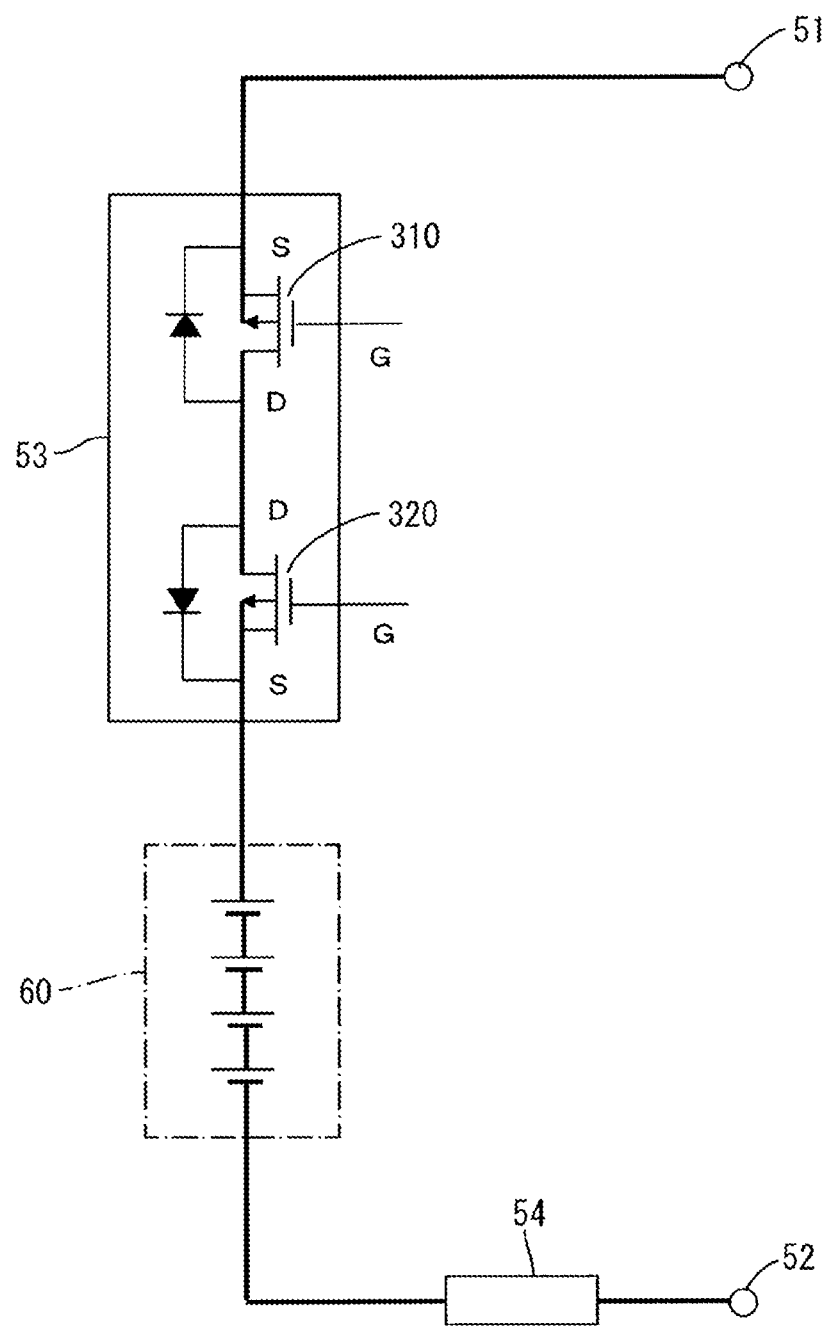
FIG. 14 is a circuit diagram of a switch.

(5) As illustrated in FIG. 14, the switch 53 may include two FETs 310 and 320 connected back-to-back. The FET 310 is a P-channel, and has a source connected to the external terminal 51 of the positive electrode. The FET 320 is a P-channel, and has a source connected to the positive electrode of the assembled battery 60. A drain of the FET 310 is connected to a drain of the FET 320.

By turning on the two FETs 310 and 320, both charge and discharge can be performed. By turning off the two FETs 310 and 320, both charge and discharge can be cut off. By turning on the FET 310 and turning off the FET 320, the discharge is cut off and only the charge is possible, and by turning off the FET 310 and turning on the FET 320, the charge is cut off and only the discharge is possible.

When the voltage of the assembled battery 60 falls below the threshold voltage V0 after parking, the management unit 130 may turn on the FET 310 and turn off the FET 320 to cut off only the discharge. In a case where charge is detected after the first time t1, when any of the secondary batteries is included in the reuse prohibition area, the two FETs 310 and 320 may be turned off to prohibit reuse of the battery 50. When all the secondary batteries are not included in the reuse prohibition area, the two FETs 310 and 320 may be turned on to enable reuse of the battery 50.

Figure 15:
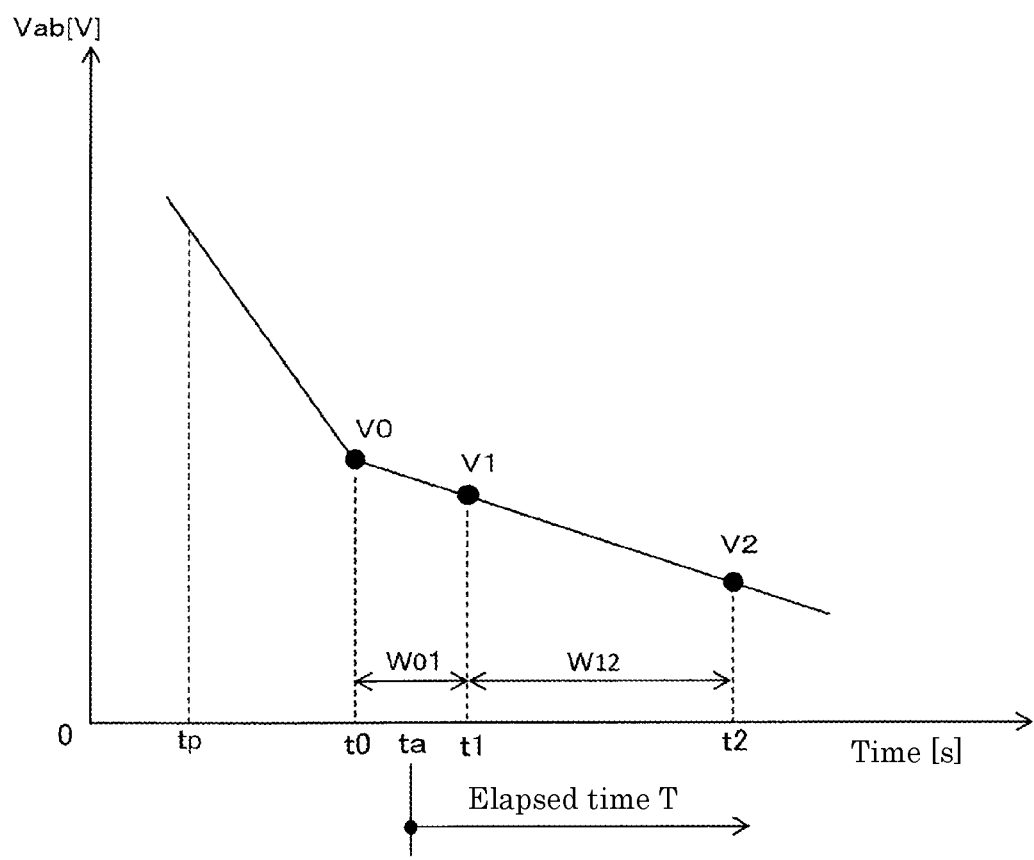
FIG. 15 is a graph showing the voltage transition of the assembled battery after parking.

(6) In the embodiment, after the discharge is cut off, the management unit 130 measures the elapsed time T from the first time t1 using the timer 135, and estimates the capacity C of each secondary battery 62 after the first time t1 based on the elapsed time T (S150). The estimation process of the capacity C (S150) may be started at any point from the time t0 to the time t1. For example, the estimation processing may be started at time ta in FIG. 15.

That is, the management unit 130 may measure the elapsed time T from the arbitrary time point ta in a first period W01, and estimate the capacity C of the secondary battery 62 after the arbitrary time point ta on the basis of the elapsed time T from the arbitrary time point ta. The capacity C may be estimated until time t2 when the voltage Vab of the assembled battery 60 decreases to the minimum operating voltage V2 of the management unit 130. In a case where charge is detected after the arbitrary time point ta, the management unit 130 may determine whether to keep the switch 53 open or close by performing the charge control flow of FIG. 11.

(8) The present technology can be applied to a capacity estimation program for an energy storage device. The capacity estimation program for an energy storage device is a program for causing a computer to execute: a process (S110) of cutting off discharge to an outside through an external terminal by controlling a switch when a voltage of the energy storage device falls below a threshold voltage equal to or higher than a minimum operating voltage of a measurement unit, and a process (S150) of estimating a capacity of the energy storage device after an arbitrary time point in a first period in which the voltage of the energy storage device decreases from the threshold voltage to the minimum operating voltage of the measurement unit based on an elapsed time from the arbitrary time point after the discharge is cut off. The present technology can be applied to a recording medium in which a capacity estimation program for an energy storage device is recorded. The computer is, for example, the management unit 130. The energy storage device is, for example, the secondary battery 62. The capacity estimation program can be recorded in a recording medium such as a ROM.

DESCRIPTION OF REFERENCE SIGNS

10: vehicle
50: battery (energy storage apparatus)
53: switch
60: assembled battery
62: secondary battery (energy storage device)
130: management unit
150: measurement unit
160: current measurement unit
170: voltage measurement unit
V1, V2: minimum operating voltage
t1: first time
T: elapsed time

The invention claimed is:

1. An energy storage apparatus comprising:
an external terminal;
an energy storage device;
a switch located in a current path from the energy storage device to the external terminal;
a measurement unit that measures a current and a voltage of the energy storage device; and
a management unit,
wherein the measurement unit and the management unit receive power supply from the energy storage device,
a minimum operating voltage of the management unit is lower than a minimum operating voltage of the measurement unit,
the management unit cuts off discharge to an outside through the external terminal by controlling the switch when the voltage of the energy storage device falls below a threshold voltage equal to or higher than the minimum operating voltage of the measurement unit, and the management unit estimates a capacity of the energy storage device after an arbitrary time point in a first period in which the voltage of the energy storage device decreases from the threshold voltage to the minimum operating voltage of the measurement unit based on an elapsed time from the arbitrary time point.

2. The energy storage apparatus according to claim 1, wherein the management unit calculates a capacity decrease amount of the energy storage device after an arbitrary time point based on the elapsed time, and the management unit estimates a capacity of the energy storage device after the arbitrary time point by subtracting the capacity decrease amount from the capacity of the energy storage device at the arbitrary time point.

3. The energy storage apparatus according to claim 1, wherein the management unit permits charge to the energy storage device by controlling the switch when the charge is detected after the arbitrary time point if the capacity of the energy storage device is within a reusable area.

4. The energy storage apparatus according to claim 1, wherein the management unit prohibits charge to the energy storage device by controlling the switch when the charge is detected after the arbitrary time point if the capacity of the energy storage device is within a reuse prohibition area.

5. The energy storage apparatus according to claim 1, wherein the energy storage apparatus is for a vehicle, the management unit cuts off discharge to an outside through the external terminal by controlling the switch when the voltage of the energy storage device falls below a threshold voltage equal to or higher than the minimum operating voltage of the measurement unit while the vehicle is parked, and the management unit estimates a capacity of the energy storage device after an arbitrary time point in a first period in which the voltage of the energy storage device decreases from the threshold voltage to the minimum operating voltage of the measurement unit based on an elapsed time from the arbitrary time point.

6. A capacity estimation method for an energy storage device provided in an energy storage apparatus, the method comprising:

cutting off discharge to an outside through an external terminal when a voltage of the energy storage device falls below a threshold voltage equal to or higher than a minimum operating voltage of a measurement unit; and estimating a capacity of the energy storage device after an arbitrary time point in a first period in which the voltage of the energy storage device decreases from the threshold voltage to the minimum operating voltage of the measurement unit based on an elapsed time from the arbitrary time point.

7. A capacity estimation program for an energy storage device, the program causing a computer to execute processes of:

cutting off discharge to an outside through an external terminal when a voltage of the energy storage device falls below a threshold voltage equal to or higher than a minimum operating voltage of a measurement unit; and estimating a capacity of the energy storage device after an arbitrary time point in a first period in which the voltage of the energy storage device decreases from the threshold voltage to the minimum operating voltage of the measurement unit based on an elapsed time from the arbitrary time point.

* * * * *